United States Patent
Choi et al.

(10) Patent No.: US 9,684,345 B2
(45) Date of Patent: Jun. 20, 2017

(54) SECONDARY MEMORY DEVICE

(71) Applicant: Samsung Electronics Co., Ltd., Gyeonggi-do (KR)

(72) Inventors: Jin-young Choi, Seoul (KR); Joon-young Oh, Seongnam-si (KR); Hee-youb Kang, Seoul (KR); Jung-hoon Kim, Hwaseong-si (KR); Won-hwa Lee, Seoul (KR); Jae-beom Byun, Suwon-si (KR); Jong-yun Yun, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 602 days.

(21) Appl. No.: 14/087,095

(22) Filed: Nov. 22, 2013

(65) Prior Publication Data

US 2014/0146461 A1 May 29, 2014

(30) Foreign Application Priority Data

Nov. 26, 2012 (KR) .................. 10-2012-0134863

(51) Int. Cl.
| | |
|---|---|
| *G11C 5/00* | (2006.01) |
| *G06F 1/18* | (2006.01) |
| *G11C 5/02* | (2006.01) |
| *H05K 7/20* | (2006.01) |
| *G06F 1/20* | (2006.01) |

(52) U.S. Cl.
CPC ............. *G06F 1/187* (2013.01); *G06F 1/203* (2013.01); *G11C 5/00* (2013.01); *G11C 5/02* (2013.01); *G11C 5/025* (2013.01); *H05K 7/20445* (2013.01); *G11B 2220/60* (2013.01)

(58) Field of Classification Search
CPC .......... G06F 1/187; G11B 2220/60–2220/657; G11C 5/00–5/148
USPC ........................................ 361/679.31–679.39
See application file for complete search history.

(56) References Cited

U.S. PATENT DOCUMENTS

| | | | | |
|---|---|---|---|---|
| 5,519,571 | A | * 5/1996 | Shieh ...................... | G06F 1/184 361/679.37 |
| 6,122,926 | A | 9/2000 | Kang et al. | |
| 7,477,520 | B2 | 1/2009 | Shibamoto et al. | |
| 7,606,035 | B2 | 10/2009 | Park et al. | |
| 7,755,897 | B2 | 7/2010 | Chen et al. | |
| 8,044,506 | B2 | 10/2011 | Yun et al. | |
| 8,125,780 | B2 | 2/2012 | Goth et al. | |

(Continued)

FOREIGN PATENT DOCUMENTS

| | | |
|---|---|---|
| JP | 2005-347500 | 12/2005 |
| KR | 1019990069446 | 9/1999 |
| KR | 1020060071161 | 6/2006 |

(Continued)

*Primary Examiner* — Ramon M Barrera
(74) *Attorney, Agent, or Firm* — Myers Bigel, P.A.

(57) ABSTRACT

A secondary memory device includes: a substrate and a housing configured to accommodate at least a part of the substrate. The substrate has upper and lower opposed surfaces and includes a first region in which a first semiconductor device is mounted on the upper surface and a second region in which a second semiconductor device is mounted on the upper surface. The housing includes a first sub-housing covering the upper surface of the substrate at the first region and the first semiconductor device. The first sub-housing does not extend to cover the upper surface of the substrate at the second region.

20 Claims, 11 Drawing Sheets

(56) References Cited

U.S. PATENT DOCUMENTS 8,184,439 B2    5/2012  Baek et al.
8,472,199 B2 *  6/2013  Kim ..................... G06F 3/0626
                                                235/380

FOREIGN PATENT DOCUMENTS

| KR | 1020070105771 | 10/2007 |
|----|---------------|---------|
| KR | 100778023     | 11/2007 |
| KR | 1020080088964 | 10/2008 |
| KR | 1020090127645 | 12/2009 |
| KR | 1020100035494 | 4/2010  |

* cited by examiner

SECONDARY MEMORY DEVICE

CROSS-REFERENCE TO RELATED APPLICATIONS

This application claims the benefit of Korean Patent Application No. 10-2012-0134863, filed on Nov. 26, 2012 in the Korean Intellectual Property Office, the disclosure of which is incorporated herein by reference in its entirety.

BACKGROUND

There is continued demand for increasing performance and improving reliability of various systems, and accordingly, performance increase and reliability improvement of server systems and personal computer systems continue to be achieved. These efforts also have been made in secondary memory device fields. To protect thermally vulnerable semiconductor devices, when a temperature rises, additional temperature rise may be reduced or prevented by limiting performance of devices or systems. However, such a method disadvantageously causes deterioration of the entire performance.

SUMMARY

According to an aspect of the inventive concept, there is provided a secondary memory device including: a substrate and a housing configured to accommodate at least a part of the substrate. The substrate has upper and lower opposed surfaces and a first region in which a first semiconductor device is mounted on the upper surface and a second region in which a second semiconductor device is mounted on the upper surface. The housing includes a first sub-housing covering the upper surface of the substrate at the first region and the first semiconductor device. The first sub-housing does not extend to cover the upper surface of the substrate at the second region.

The housing may further include a second sub-housing covering at least a portion of the upper surface of the substrate at the second region and the second semiconductor device, wherein an upper surface of the housing has an opening defined therein between the first sub-housing and the second sub-housing, the opening exposing a portion of the upper surface of the substrate between the first semiconductor device and the second semiconductor device.

The secondary memory device may further include: a block wall formed between the first sub-housing and the second sub-housing and configured to inhibit convection between the first sub-housing and the second sub-housing.

The housing may include a lower open portion through which at least a part of the lower surface of the substrate is exposed. The secondary memory device may further include: a first cover unit configured to detachably cover the lower open portion.

One or more super capacitors may be mounted in the surface of the substrate exposed by the lower open portion.

A plurality of holes may be formed in the housing. In some embodiments, the housing includes a second sub-housing at least partially covering the upper surface of the substrate at the second region. The plurality of holes may be formed in the second sub-housing to at least partially expose the upper surface of the substrate at the second region and/or the second semiconductor device.

The secondary memory device may further include: a heat transfer medium disposed between the first sub-housing and the first semiconductor device.

The secondary memory device may further include: a connector configured to transmit a signal between the substrate and an external device or supply power, wherein a distance between the first semiconductor device and the connector is shorter than a distance between the second semiconductor device and the connector.

The housing may include a second sub-housing including an upper open portion exposing at least a part of the upper surface of the substrate at the second region. The housing may include a first spacer disposed between the first sub-housing and the substrate and having a thermal conductivity lower than that of the first sub-housing. The first spacer may be formed of an elastic material.

The secondary memory device may further include: a second cover unit configured to cover the upper open portion, wherein the second cover unit is configured to be detachably coupled to the second sub-housing.

According to another aspect of the inventive concept, there is provided a solid state drive (SSD) including: a substrate; a nonvolatile memory device mounted on the substrate; a controller device configured to control the nonvolatile memory device mounted on the substrate; and a housing configured to accommodate the substrate, wherein a part of the housing includes an open portion exposing at least a part of the substrate between the nonvolatile memory device and the controller device.

The SSD may further include: a separation spacer disposed in the open portion, the separation spacer extending from an external surface of the housing to an upper surface of the substrate, and the separation spacer having a thermal conductivity lower than that of the housing.

According to another aspect of the inventive concept, a secondary memory device includes: a housing; a substrate having upper and lower opposing surfaces, with the substrate held at least partially within the housing; a first semiconductor device on the upper surface of the substrate at a first region of the substrate; and a second semiconductor device on the upper surface of the substrate at a second region of the substrate. The housing has an upper surface, with the upper surface of the housing covering the first semiconductor device, and with the upper surface of the housing including an opening disposed between the first semiconductor device and the second semiconductor device and exposing a portion of the substrate upper surface The housing may include a guide wall extending downwardly from the upper surface of the housing toward the upper surface of the substrate at the opening in the upper surface of the housing. A spacer may be provided between the guide wall and the upper surface of the substrate. In some embodiments, a spacer is disposed in the opening of the upper surface of the housing and extending to the upper surface of the substrate.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
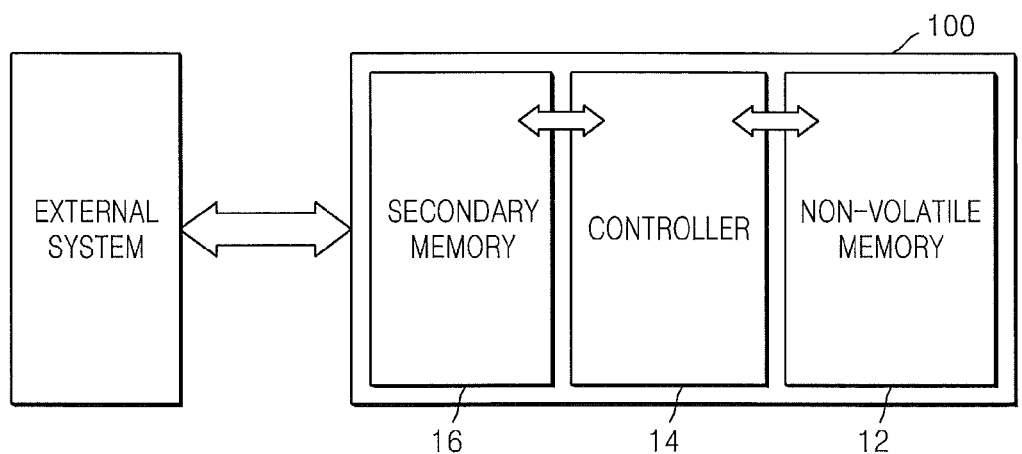
FIG. 1 is a schematic diagram showing a relationship between core elements of a secondary memory device and an external system according to embodiments of the inventive concept.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. In the drawings, like reference numerals denote like elements throughout. Also, various elements and regions are schematically drawn. Accordingly, the current inventive concept is not limited to the relative size and gaps shown in the drawings.

It will be understood that, although the terms first, second, third, etc., may be used herein to describe various elements, these elements should not be limited by these terms. These terms are only used to distinguish one element, component, region, layer or section from another element, component, region, layer or section. For example, without departing from the scope of the inventive concept, a first constituent element may be designated as a second constituent element, and similarly, the second constituent element may be designated as the first constituent element.

The terminologies used herein are for the purpose of describing particular embodiments only and are not intended to be limiting of the inventive concept. As used herein, singular forms are intended to include plural forms as well, unless the context clearly indicates otherwise. It will be further understood that the terms "comprise" and/or "comprising," when used in this specification, specify the presence of stated features, steps, operations, and/or components, but do not preclude the presence or addition of one or more other features, steps, operations, and/or components, and/or groups thereof.

Unless otherwise defined, all terms including technical and scientific terms used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items.

Embodiments of the inventive concept provide a secondary memory device including a substrate including a first region in which a first semiconductor device is mounted and a second region in which a second semiconductor device is mounted and a housing accommodating at least a part of the substrate. The housing may include a first sub-housing covering the first region. The first sub-housing may extend over an upper portion of the first semiconductor device and not extend to cover the second region of the substrate.

The first semiconductor device may be greater than the second semiconductor device in terms of a heating value according to an operation. In other words, semiconductor devices mounted on a substrate may have different heating characteristics due to various factors such as functions and operation methods, etc. In this regard, it is assumed that the heating value of the first semiconductor device is greater than that of the second semiconductor device. In addition, a reference of the heating value may be based on an average temperature of a semiconductor device during a predetermined operating time between about 5 minutes and about 120 minutes.

Also, semiconductor devices may have different heat resistance characteristics. If a temperature of a semiconductor device rises to a heat resistance limit, the semiconductor device may not sufficiently show its performance well and the semiconductor device may function as a bottleneck and adversely affect another semiconductor device's performance.

An example in which such thermal budget problem frequently occurs is a secondary memory device such as a solid state drive (SSD).

FIG. 1 is a schematic diagram showing a relationship between core elements of a secondary memory device 100 and an external system according to an embodiment of the inventive concept. Although the secondary memory device 100 is an SSD in FIG. 1, the inventive concept is not limited thereto.

Referring to FIG. 1, the secondary memory device 100 may include a nonvolatile memory 12 for storing data and a controller 14 for controlling input and output of the data to the nonvolatile memory 12. Selectively, the secondary memory device 100 may further include a secondary memory 16 for buffering a difference between a data transmission speed between the controller 14 and the nonvolatile memory 12 and a data read and write speed.

As shown in FIG. 1, data input from the external system may be stored in the nonvolatile memory 12 via the secondary memory 16 and the controller 14. The controller 14 may read the data from the nonvolatile memory 12 and transmit the data to the external system through the secondary memory 16.

Figure 2A:
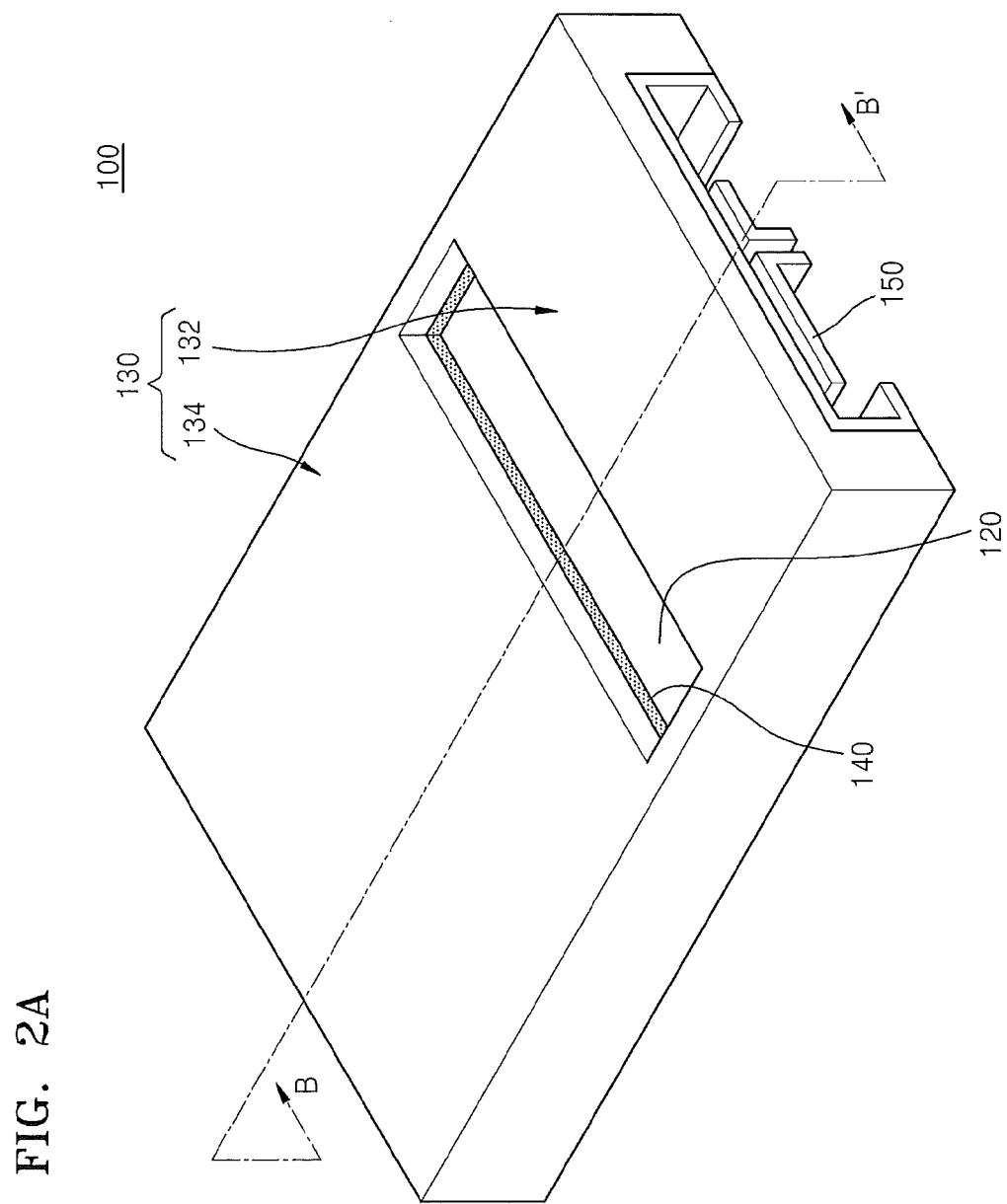
FIG. 2A is a perspective view of a secondary memory device according to embodiments of the inventive concept.
Figure 2B:
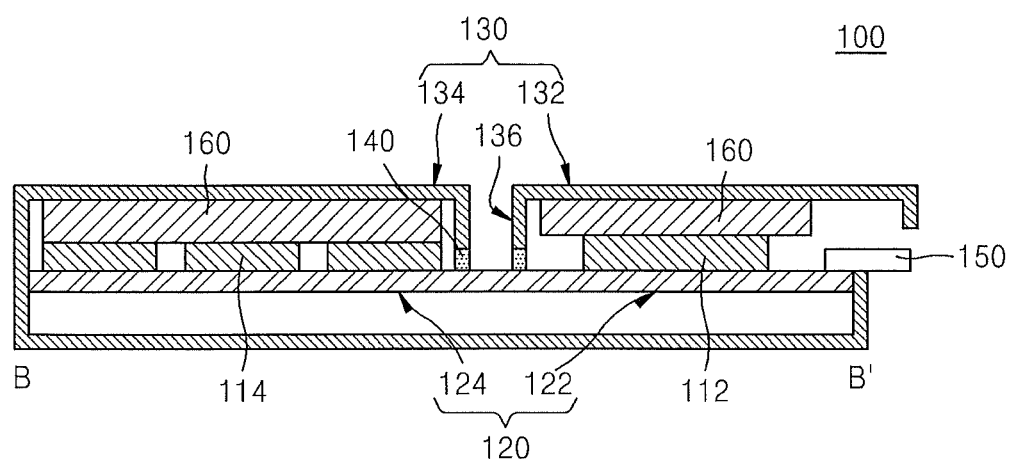
FIG. 2B is a lateral cross-sectional view of the secondary memory device of FIG. 2A taken along a line B-B'.

FIG. 2A is a perspective view of the secondary memory device 100 according to an embodiment of the inventive concept. FIG. 2B is a lateral cross-sectional view of the secondary memory device 100 of FIG. 2A taken along a line B-B'.

Referring to FIGS. 2A and 2B, a first semiconductor device 112 and a second semiconductor device 114 are provided on a substrate 120. In particular, the first semiconductor device 112 may be provided on a first region 122 of the substrate 120, and the second semiconductor device 114 may be provided on a second region 124 of the substrate 120. When the secondary memory device 100 is an SSD, the second semiconductor device 114 may be a nonvolatile memory device and the first semiconductor device 112 may be a controller for controlling the nonvolatile memory device. The substrate 120 may have a first or upper surface and an opposed second or lower surface, with the devices 112, 114 provided on the first or upper surface.

The substrate 120 may be, for example, a printed circuit board (PCB) or a flexible PCB (FPCB). Also, the second semiconductor device 114 may be, for example, a flash memory, a phase-change random access memory (PRAM), a resistive RAM (RRAM), a ferroelectric RAM (FeRAM), or a magnetic RAM (MRAM), but the inventive concept is not limited thereto. The flash memory may be a NAND flash memory. The second semiconductor device 114 may be a single semiconductor chip or a stack of semiconductor chips.

One second semiconductor device 114 or two or more second semiconductor devices 114 may be mounted in the second region 124.

The first semiconductor device 112 may be a controller to perform functions of wear leveling, error correction, and/or fail block control of the second semiconductor device 114. Also, the first semiconductor device 112 may include a program for exchanging signals with external devices in a method according to an SATA standard, a PATA standard, or an SCSI standard. In this regard, the SATA standard includes all SATA group standards, such as SATA-2, SATA-3, e-SATA (external SATA) as well as SATA-1. The PATA standard includes all integrated drive electronic (IDE) group standards, such as IDEs and enhanced-IDE (E-IDE). The standards of serial ATA revision 2.6 published by the Serial ATA International Organization on Feb. 15, 2007 is incorporated by reference herein in its entirety.

Upon comparing the first semiconductor device 112 and the second semiconductor device 114, the first semiconductor device 112 may be greater than the second semiconductor device 114 in terms of a heating value according to an operation.

At least a part of the substrate 120 may be accommodated in a housing 130. The housing 130 includes a first housing portion or first sub-housing 132 covering or overlying the first region 122 of the substrate 120. The first sub-housing 132 (e.g., an upper portion or surface thereof) may cover or overlie the first semiconductor device 112. A heat transfer medium 160 may be disposed between the first sub-housing 132 and the first semiconductor device 112.

The heat transfer medium 160 is a material for boosting heat transfer of heat generated by the first semiconductor device 112 to the outside (e.g., outside the housing 130). Thus, a heat dissipation rate from the first semiconductor device 112 may be faster when there is the heat transfer medium 160 than when there is no heat transfer medium 160. Such operation may be performed by the heat transfer medium 160. More specifically, the heat transfer medium 160 may be called a thermal interface material (TIM) for reducing contact thermal resistance, for example, a heat dissipation grease, a heat dissipation sheet, a heat dissipation pad, a thermally conductive adhesive, and a phase change material. More specifically, a commercially available heat dissipation grease includes ShinEtsu G750, ShinEtsu G751, ShinEtsu G765, Berquist TIC-7500, the phase change material includes Thermax HF60110-BT, Chromerics T725, Chromerics T443, Chromerics T454, Thermagon T-pcm 905c, Berquist 200U, Berquist HiFlow 225-U, Berquist HiFlow 225-UT, and the thermally conductive adhesive includes Chromerics therm-A-form T642. However, the inventive concept is not limited thereto.

The first sub-housing 132 (e.g., an upper surface thereof) may extend over an upper portion of the first semiconductor device 112 and not extend to the second region 124 of the substrate 120. Were the first sub-housing 132 to extend over the second region 124, heat transferred from the first semiconductor device 112 to the first sub-housing 132 may be further transferred in a horizontal direction of FIG. 2B so that a temperature of the second semiconductor device 114 in the second region 124 may rise.

When the second semiconductor device 114 is a nonvolatile memory such as a NAND device, the second semiconductor device 114 may be thermally vulnerable. As described above, the second semiconductor device 114 may not sufficiently show its performance due to the heat transferred from the first sub-housing 132. A control program may be configured such that an operation of the second semiconductor device 114 stops or has a reduced operating speed when the temperature of the second semiconductor device 114 rises higher than a predetermined temperature in order to prevent additional heat generation. The control program may be stored and executed in the first semiconductor device 112.

A connector 150 may be provided at or in one end of the substrate 120 so as to allow the secondary memory device 100 to be electrically connected to an external device and transmit and receive a signal to and from the external device and/or receive a power supply. The connector 150 may be configured to be connected to the external device according to an SATA standard, a PATA standard, or an SCSI standard.

In particular, the first semiconductor device 112 may be disposed closer to the connector 150. In other words, a distance between the semiconductor device 112 and the connector 150 may be shorter than a distance between the second semiconductor device 114 and the connector 150. Accordingly, heat generated by the first semiconductor device 112 having a higher temperature than that of the second semiconductor device 114 may be transferred to the external device and/or a lower portion of the housing 130 through the connector 150. As a result, a temperature rise of the first semiconductor device 112 may be inhibited.

The housing 130 may further include a second housing portion or second sub-housing 134 (e.g., an upper portion or surface thereof) covering the second region 124 of the substrate. In this regard, the first sub-housing 132 may not extend to meet the second sub-housing 134. If the first sub-housing 132 extends to meet the second sub-housing 134 over the upper portion of the first semiconductor device 112, a considerable amount of the heat generated by the first semiconductor device 112 may be transferred to the second semiconductor device 114 sequentially through the first sub-housing 132 and the second sub-housing 134. Put another way, at least a portion of the upper surface of the first sub-housing 132 may not extend to meet at least a portion the upper surface of the second sub-housing 134 thereby forming a gap or opening therebetween. Stated differently, an upper surface of the housing 130 may have an opening (e.g., an upper opening) defined therein between the first sub-housing 132 and the second sub-housing 134, with the opening exposing a portion of the upper surface of the substrate 120 between the first semiconductor device 112 and the second semiconductor device 114.

The housing 130 may further include a block wall 136 between the first sub-housing 132 and the second sub-housing 134. The block wall 136 may be configured to inhibit or prevent heat transfer due to convection between the first sub-housing 132 and the second sub-housing 134. In other words, the block wall 136 may inhibit or prevent heated air in the first sub-housing 132 from being transferred by convection to the second sub-housing 134.

The block wall 136 may be provided in an edge of the first sub-housing 132, in an edge of the second sub-housing 134, or in edges of both the first sub-housing 132 and the second sub-housing 134. The block wall 136 may protect semiconductor devices mounted in or on the substrate 120 from foreign materials.

A first spacer 140 may be provided between the substrate 120 and the block wall 136. The first spacer 140 may be formed of a material having a thermal conductivity lower than that of the housing 130, for example, epoxy based polyurethane, an aerogel material, Teflon, mica, etc. Since the thermal conductivity of the first spacer 140 is low, even if the heat generated by the first semiconductor device 112 is transferred through the first sub-housing 132 and the block wall 136, the heat may not be transferred to the substrate 120.

The first spacer 140 may function as a sealing material for maintaining a seal between the housing 130 and the substrate 120. In this case, the first spacer 140 may be formed of an elastic material.

Even if the first spacer 140 is formed of the elastic material, an exposed part or portion of the substrate 120 may be coated so as to inhibit or prevent the substrate 120 from being damaged due to contact with the first spacer 140 and/or inhibit or prevent the exposed part of the substrate 120 from being damaged due to the external environment. The substrate 120 may be coated with a non-conductive polymer material having an appropriate mechanical strength.

The housing 130 may be formed of a single material in its entirety or a combination of different materials in consideration of heat transfer characteristics. For example, the housing 130 may be formed of a metal material such as copper, aluminum, and stainless steel, a carbon based material, and a polymer material such as epoxy resin, polymethymethacrylate (PMMA), polycarbonate (PC), polyethylene (PE), polypropylene (PP), etc. However, the inventive concept is not limited thereto.

A heat transfer medium 160 may be provided between the second sub-housing 134 and the second semiconductor device 114. The heat transfer medium 160 may be used to transfer heat generated by the second semiconductor device 114 to the second sub-housing 134 by conduction. As a result, a temperature rise of the second semiconductor device 114 may be inhibited so that the second semiconductor device 114 may have enhanced performance.

As described above, a housing of the upper portion of the first semiconductor device 112 having a higher heating value does not extend to the upper portion of the second semiconductor device 114 having a low heating value, and thus the first semiconductor device 112 and the second semiconductor device 114 that differ in terms of the heating characteristic may be disposed in substantially separated compartments.

Figure 3:
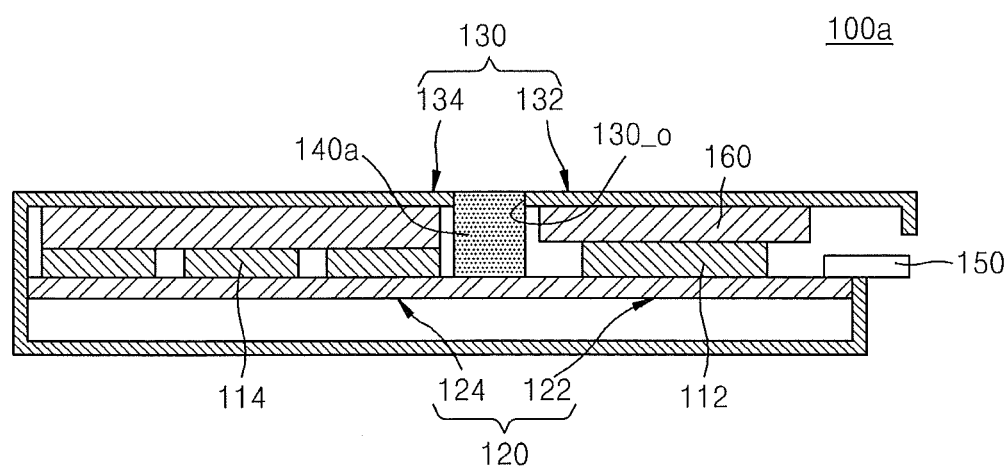
FIGS. 3 through 5 are lateral cross-sectional and perspective views of secondary memory devices according to other embodiments of the inventive concept.

FIG. 3 is a lateral cross-sectional view of a secondary memory device 100a according to another embodiment of the inventive concept. Referring to FIG. 3, the first semiconductor device 112 and the second semiconductor device 114 are mounted on the substrate 120, and the substrate 120 is accommodated in the housing 130. The redundant descriptions between FIGS. 2A through 3 are omitted here for convenience of explanation.

An upper opening, gap or open portion 130_o used to expose at least a part of the substrate 120 may be formed between the first sub-housing 132 and the second sub-housing 134 (e.g., the open portion 130_o may be formed in the housing 130). The open portion 130_o may be disposed between the first semiconductor device 112 and the second semiconductor device 114. That is, an upper surface of the housing 130 may have the opening 130_o defined therein between the first sub-housing 132 and the second sub-housing 134, with the opening 130_o exposing a portion of the upper surface of the substrate 120 between the first semiconductor device 112 and the second semiconductor device 114. Although a block wall is omitted in FIG. 3, the block wall 136 may be further provided as shown in FIG. 2B. That is, the block wall 136 may extend downwardly toward the substrate 120 at the opening 130_o. The spacer(s) 140 may also be provided as shown in FIG. 2B.

A separation spacer 140a may be provided in the open portion 130_o. The separation spacer 140a may be formed of a material having a lower thermal conductivity than that of the housing 130. For example, the separation spacer 140a may be formed of a material as described above in connection with the first spacer 140. The separation spacer 140a may be selectively formed of an elastic material such that a lower part of the first sub-housing 132 and a lower part of the second sub-housing 134 may be separated.

The separation spacer 140a may extend from an upper surface of the housing 130 to an upper surface of the substrate 120. Even if the separation spacer 140a is formed of the elastic material, an exposed part or portion of the substrate 120 may be coated so as to inhibit or prevent the substrate 120 from being damaged due to contact with the separation spacer 140a and/or to inhibit or prevent the exposed part of the substrate 120 from being damaged due to the external environment. The substrate 120 may be coated with a non-conductive polymer material having an appropriate mechanical strength.

Figure 4:
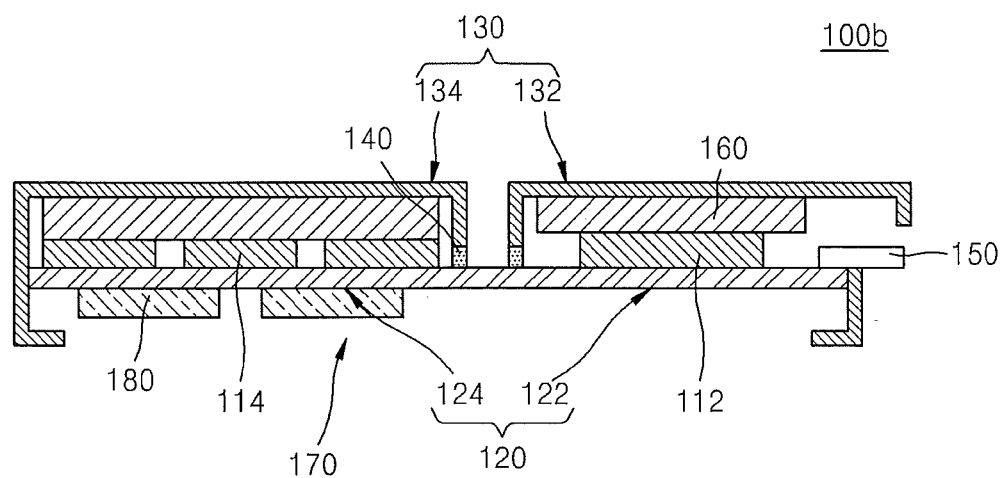

FIG. 4 is a lateral cross-sectional view of a secondary memory device 100b according to another embodiment of the inventive concept. Referring to FIG. 4, the first semiconductor device 112 and the second semiconductor device 114 are mounted on the substrate 120, and the substrate 120 is accommodated in the housing 130. The redundant descriptions between FIGS. 2A, 2B and 4 are omitted here for convenience of explanation.

The housing 130 may include a back, bottom or lower open portion 170 through which at least a part of a surface of the substrate 120 opposite to a surface thereof in which the first semiconductor device 112 is mounted is exposed (e.g., the lower surface of the substrate 120). One or more energy storage and supply device or media 180 may be mounted in or on the surface of the substrate 120 opposite to the surface thereof in which the first semiconductor device 112 is mounted.

The energy storage and supply media 180 may be any devices capable of storing and appropriately supplying energy when necessary, for example, a super capacitor, a lithium ion battery, a nickel cadmium battery, a nickel metal hydride battery, etc. In particular, the super capacitor may be, for example, an electric double layer capacitor (EDLC) or a multilayer ceramic capacitor (MLCC), etc. but the inventive concept is not limited thereto. Also, the energy storage and supply media 180 may be configured by symmetrically aligning and bonding, for example, electrolytes, current collectors, and electrodes with respect to a separation film and encapsulating them.

The energy storage and supply media 180 may be vulnerable to heat, and thus the energy storage and supply media 180 may be spaced apart from the first semiconductor device 112 (e.g., as far as possible). Also, a location and size of the back open portion 170 may be determined and/or selected such that the energy storage and supply media 180 may be exposed as much as possible. For example, the location and size of the back open portion 170 may be determined and/or selected such that the energy storage and supply media 180 may be entirely exposed.

When the energy storage and supply media 180 is exposed wholly or partially, a temperature rise of the energy storage and supply media 180 may be effectively inhibited due to natural convection and/or forced convection. In particular, when the secondary memory device 100b is disposed near a cooling fan of a system, a cooling fan of a central processing unit, a cooling fan of a video card, etc., the exposed parts of the energy storage and supply media 180 may be effectively cooled due to the natural convection and/or partial forced convection.

Figure 5:
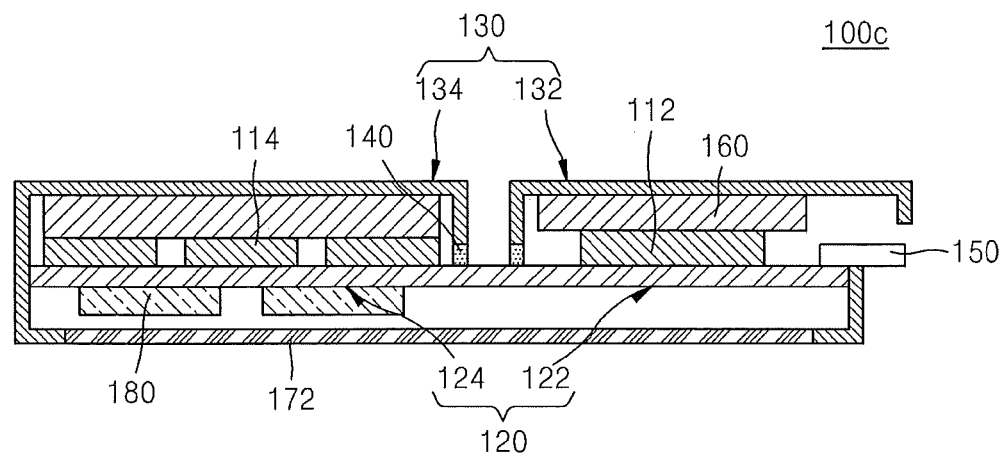

FIG. 5 is a perspective view of a secondary memory device 100c according to another embodiment of the inventive concept. The embodiment of FIG. 5 is different from the embodiment described with reference to FIG. 4 in that the secondary memory device 100c further includes a first cover unit 172 covering the back open portion 170. Thus, the redundant descriptions between FIGS. 4 and 5 are omitted and the first cover unit 172 will now be described.

The first cover unit 172 may be detachably coupled to the housing 130. The first cover unit 172 may cover at least a part of the back open portion 170 by being attached to the housing 130. For example, the first cover unit 172 may cover the entire back open portion 170 by being attached to the housing 130.

The first cover unit 172 may be formed of the same material as or a different material from the housing 130. During a normal operation, the first cover unit 172 may be used by being attached to the secondary memory device 100c. When semiconductor devices mounted in the substrate 120 are deemed to generate excessive heat, the semiconductor devices may be more quickly cooled by removing the first cover unit 172.

A method of detachably coupling the first cover unit 172 to the housing 130 may be any method known to the pertinent art and is not particularly limited. For example, the first cover unit 172 may be detachably coupled to the housing 130 by inserting a concave member or unit (or a convex member or unit) formed in the first cover unit 172 into a convex member or unit (or a concave member or unit) formed in the housing 130.

Figure 6A:
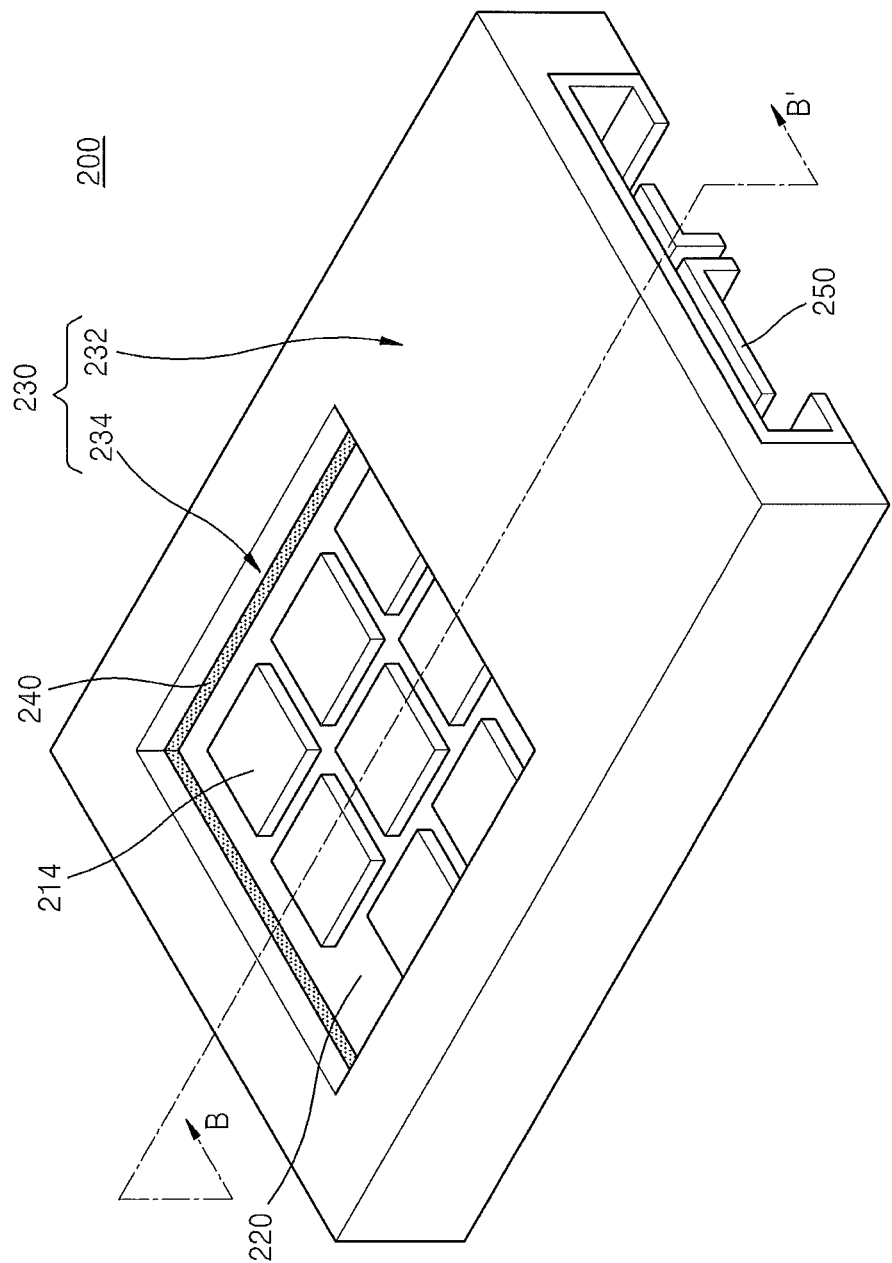
FIG. 6A is a perspective view of a secondary memory device according to other embodiments of the inventive concept.
Figure 6B:
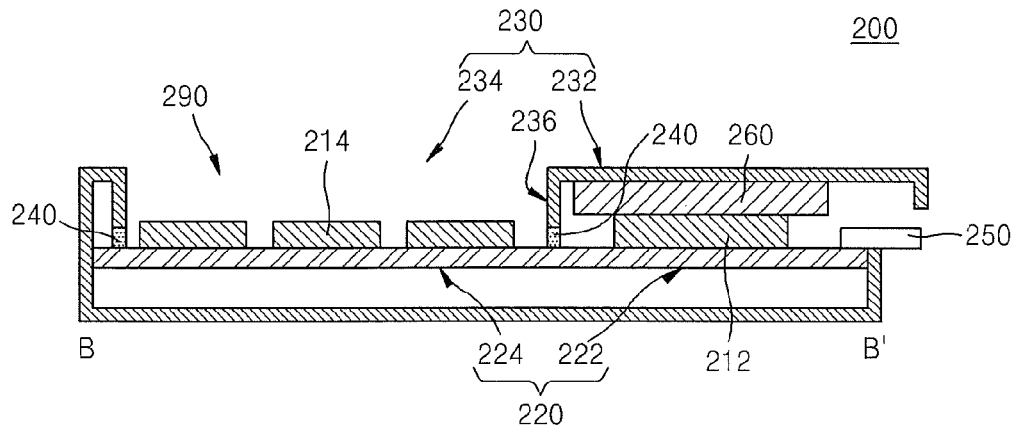
FIG. 6B is a lateral cross-sectional view of the secondary memory device of FIG. 6A taken along a line B-B'.

FIG. 6A is a perspective view of a secondary memory device 200 according to another embodiment of the inventive concept. FIG. 6B is a lateral cross-sectional view of the secondary memory device 200 of FIG. 6A taken along a line B-B'.

Referring to FIGS. 6A and 6B, a first semiconductor device 212 and a second semiconductor device 214 are provided on a substrate 220. In particular, the first semiconductor device 212 may be provided on a first region 222 of the substrate 220, and the second semiconductor device 214 may be provided on a second region 224 of the substrate 220. When the secondary memory device 200 is an SSD, the second semiconductor device 214 may be a nonvolatile memory device and the first semiconductor device 212 may be a controller for controlling the nonvolatile memory device.

A housing 230 includes a first housing portion or first sub-housing 232 covering the first region 222 of the substrate 220. The first sub-housing 232 may cover or overlie the first semiconductor device 212. A heat transfer medium 260 may be disposed between the first sub-housing 232 and the first semiconductor device 212.

The substrate 220, the first semiconductor device 212, the second semiconductor device 214, the heat transfer medium 260, a connector 250, and a block wall 236 are the same as described with reference to FIGS. 2A and 2B, and thus detailed descriptions thereof are omitted here.

The first sub-housing 232 (or an upper surface thereof) may extend to or over an upper portion of the first semiconductor device 212 but does not extend to or over the second region 224 of the substrate 220. Were the first sub-housing 232 to extend to the second region 224 over the upper portion of the first semiconductor device 212, heat transferred from the first semiconductor device 212 to the first sub-housing 232 may be further transferred in a horizontal direction of FIG. 6B so that a temperature of the second semiconductor device 214 in the second region 224 may rise.

When the second semiconductor device 214 is a nonvolatile memory such as a NAND device, the second semiconductor device 214 may be thermally vulnerable. As described above, the second semiconductor device 214 may not sufficiently show its performance due to the heat transferred from the first sub-housing 232. A control program may be configured so that an operation of the second semiconductor device 214 stops or has a reduced operating speed when the temperature of the second semiconductor device 214 rises higher than a predetermined temperature (e.g., to prevent additional heat generation). The control program may be stored and executed in the first semiconductor device 212.

The housing 230 may include a second housing portion or second sub-housing 234 having a front, top or upper open portion 290 exposing at least a part of the second region 224. The front open portion 290 exposes at least a part of the second region 224 so that at least a part of the second semiconductor device 214 may be exposed to the outside. Accordingly, heat generated by the first semiconductor device 212 may be inhibited or prevented from being transferred from or through the housing 230 to an upper portion of the semiconductor device 214.

Also, the heat generated by the second semiconductor device 214 may be directly removed to the outside by convection, thereby contributing to the inhibition of a temperature rise of the second semiconductor device 214.

As described with reference to FIGS. 2A and 2B, a first spacer 240 may be provided between the substrate 220 and the block wall 236. The first spacer 240 may be formed of a material having a lower thermal conductivity than that of the housing 230. The material is described with reference to FIGS. 2A and 2B and thus a detailed description thereof is omitted here. Since the thermal conductivity of the first spacer 240 is low, even if the heat generated by the first semiconductor device 212 is transferred through the first sub-housing 232 and the block wall 236, the heat may not be transferred to the substrate 220.

The first spacer 240 may function as a sealing material for maintaining a seal between the housing 230 and the substrate 220. In this case, the first spacer 240 may be formed of an elastic material.

Even if the first spacer 240 is formed of the elastic material, an exposed part of the substrate 220 may be coated so as to inhibit or prevent the substrate 220 from being damaged due to contact with the first spacer 240 and/or to inhibit or prevent the exposed part of the substrate 220 from being damaged due to the external environment. The substrate 220 may be coated with a non-conductive polymer material having an appropriate mechanical strength.

Figure 7:
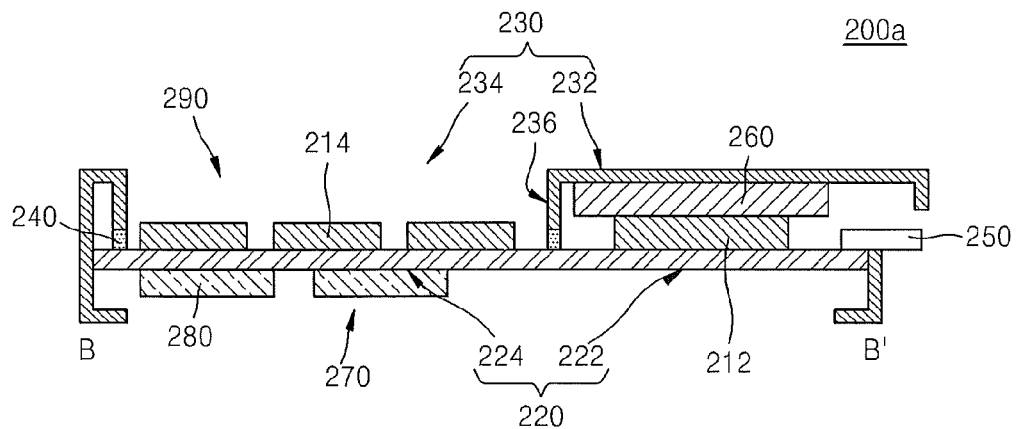
FIGS. 7 through 10 are lateral cross-sectional and perspective views of secondary memory devices according to other embodiments of the inventive concept.

FIG. 7 is a lateral cross-sectional view of a secondary memory device 200*a* according to another embodiment of the inventive concept.

Referring to FIG. 7, a back, bottom or lower open portion 270 may be formed in the housing 230 through which at least a part of a surface of the substrate 220 opposite to a surface thereof in which the first semiconductor device 212 is mounted is exposed. Further, one or more energy storage and supply media or devices 280 may be mounted in or on the surface of the substrate 220 and may be exposed by the back open portion 270.

As described with reference to FIG. 4, the energy storage and supply media 280 may be vulnerable to heat, and thus the energy storage and supply media 280 may be spaced apart from the first semiconductor device 212 (e.g., as far as possible). In this case, as shown in FIG. 7, both an upper side and a lower side of a partial region of the substrate 220 may be exposed. For example, both an upper side and a lower side of the second region 224 of the substrate 220 may be exposed. When both the upper side and the lower side of the second region 224 are exposed, heat may be transferred to the outside due to convection and temperature rises of the energy storage and supply media 280 and/or the second semiconductor device 214 may be effectively inhibited.

Since the first sub-housing 232 is limited to the first region 222 only, the heat removal from the first semiconductor device 212 due to conduction may be less efficient than a case where the first sub-housing 232 extends to or over an upper portion of the second region 224. However, when the first semiconductor device 212 is expected to have a high heating value the first semiconductor device 212 is designed to have an enough thermal budget. Therefore a limitation of the first sub-housing 232 may adversely affect performance of the first semiconductor device 212 only slightly.

Meanwhile, the second semiconductor device 214 or the energy storage and supply media 280 may be very vulnerable to heat or may be designed with little margin for the thermal budget. In this case, performance of devices arranged in or on the second region 224 of the substrate 220 may deteriorate even with a small temperature rise. In other words, performance of devices arranged in the second region 224 may be expected to improve by providing a margin of a small thermal budget.

As described with reference to FIGS. 6A, 6B, and 7, a path of transferring the heat generated by the first semiconductor device 212 to the second semiconductor device 214 through conduction may be blocked, and an independent heat transfer path of the second semiconductor device 214 through convection is secured, thereby relaxing the thermal budget of the second semiconductor device 214 and achieving a performance enhancement of the secondary memory devices 200 and 200*a*.

Figure 8:
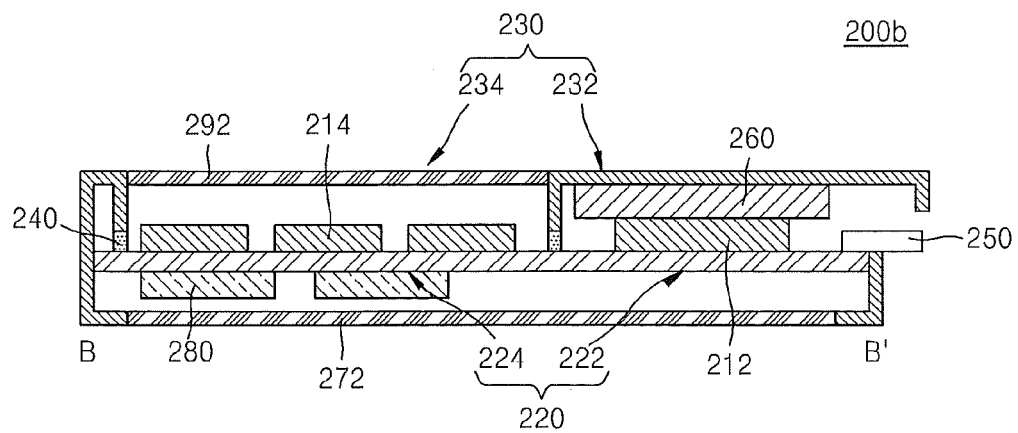

FIG. 8 is a lateral cross-sectional view of a secondary memory device 200*b* according to another embodiment of the inventive concept.

The embodiment of FIG. 8 is the same as the embodiment of FIG. 7 except that a first cover unit 272 and a second cover unit 292 are respectively included in the back open portion 270 and the front open portion 290, and thus the redundant descriptions therebetween are omitted.

The first cover unit 272 and the second cover unit 292 may each be detachably coupled to the housing 230. The first cover unit 272, and the second cover unit 292 may cover at least a part of the back open portion 270 and the front open portion 290, respectively, by being coupled to the housing 230. For example, the first cover unit 272 may cover the entire back open portion 270 by being attached to the housing 230. Also, the second cover unit 292 may cover the entire front open portion 290 by being attached to the housing 230. Although FIG. 8 shows the embodiment in which both the first cover unit 272 and the second cover unit 292 are present, only one of them may be present in some embodiments.

A method of detachably coupling the first cover unit 272 and the second cover unit 292 to the housing 230 is the same as the method of coupling the first cover unit 172 to the housing 130 with reference to FIG. 5. Materials and functions of the first cover unit 272 and the second cover unit 292 are the same as described above with reference to the over unit 172.

Figure 9:
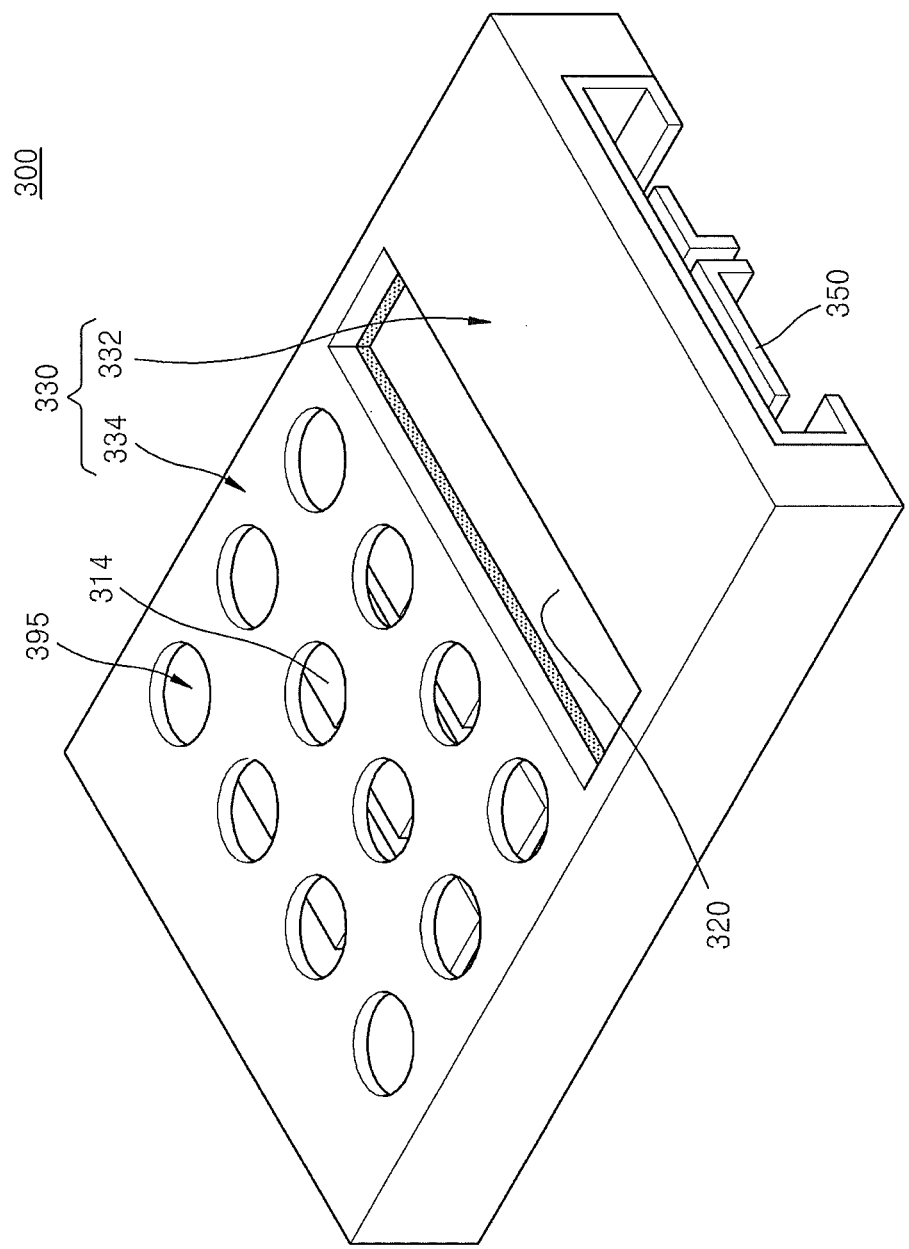

FIG. 9 is a perspective view of a secondary memory device 300 according to another embodiment of the inventive concept.

Referring to FIG. 9, instead of forming the single large front open portion 290 as shown in FIG. 6A, a plurality of apertures, holes or openings 395 may be formed in a second housing portion or second sub-housing 334 (e.g., in an upper surface thereof). Although no hole is formed in a first housing portion or first sub-housing 332 of FIG. 9, holes may be formed in the first sub-housing 332 as in the second sub-housing 334.

The holes 395 are not necessarily circular; the holes may be oval, triangular, rectangular, polygonal such as hexagonal, or similar optional shapes. Also, the plurality of holes 395 are not necessarily arranged in a lattice shape and but may be arranged in a zigzag, for example.

Heat generated by a second semiconductor device 314 may be removed by convection through the plurality of holes 395. Sizes and/or arrangement of the holes 395 may be appropriately adjusted to protect a substrate 320 from an external shock, and thus semiconductor devices mounted on the substrate 320 may be safely protected.

Figure 10:
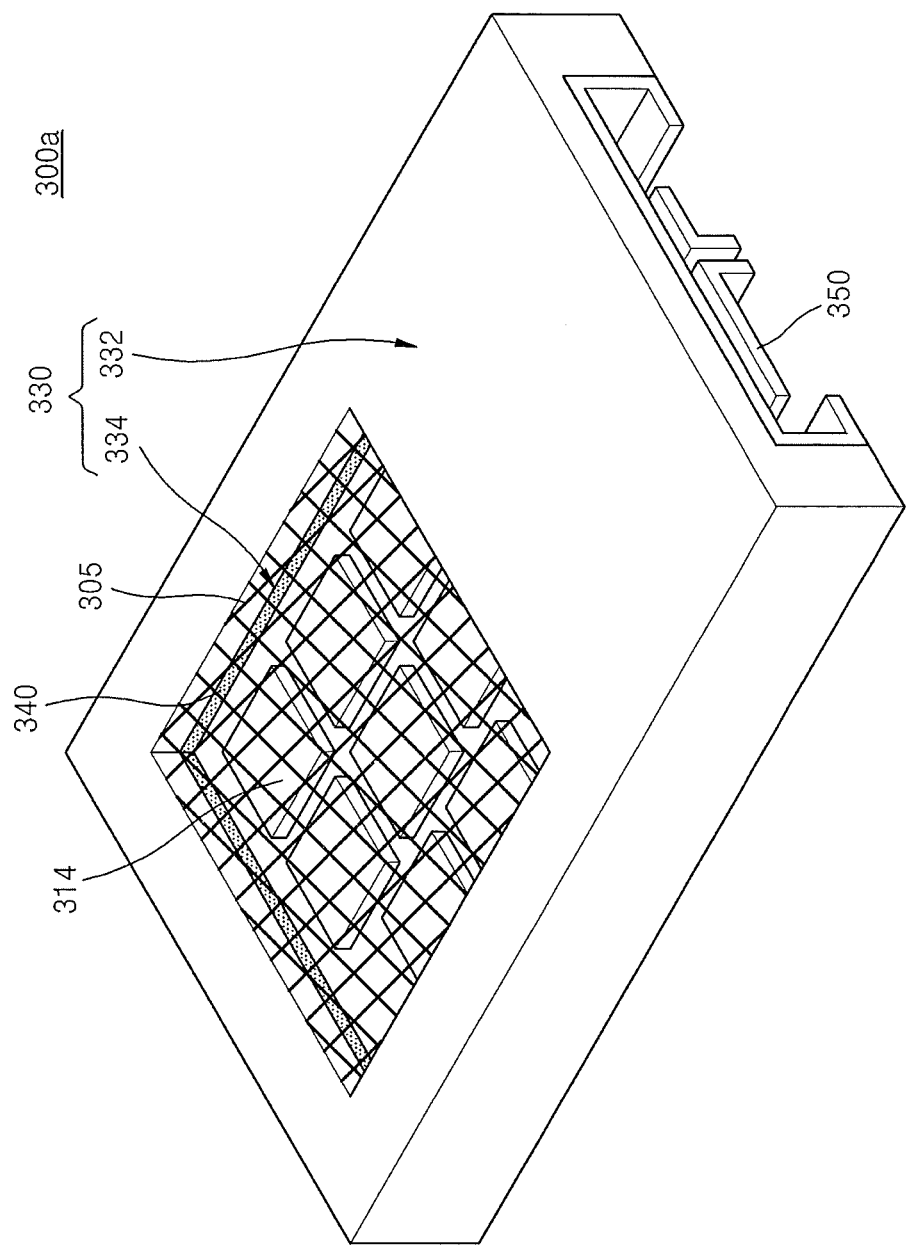

FIG. 10 is a perspective view of a secondary memory device 300*a* according to another embodiment of the inventive concept.

Referring to FIG. 10, a mesh 305 may be further formed in the front open portion 290, compared to the embodiment of FIGS. 6A and 6B, and thus the equivalent effect as that of the embodiment of FIGS. 6A and 6B may be produced without forming the plurality of holes 395 in a housing 330 as shown in FIG. 9.

The mesh 305 may be formed of a metal wire having a suitable thickness and strength.

Figure 11A:
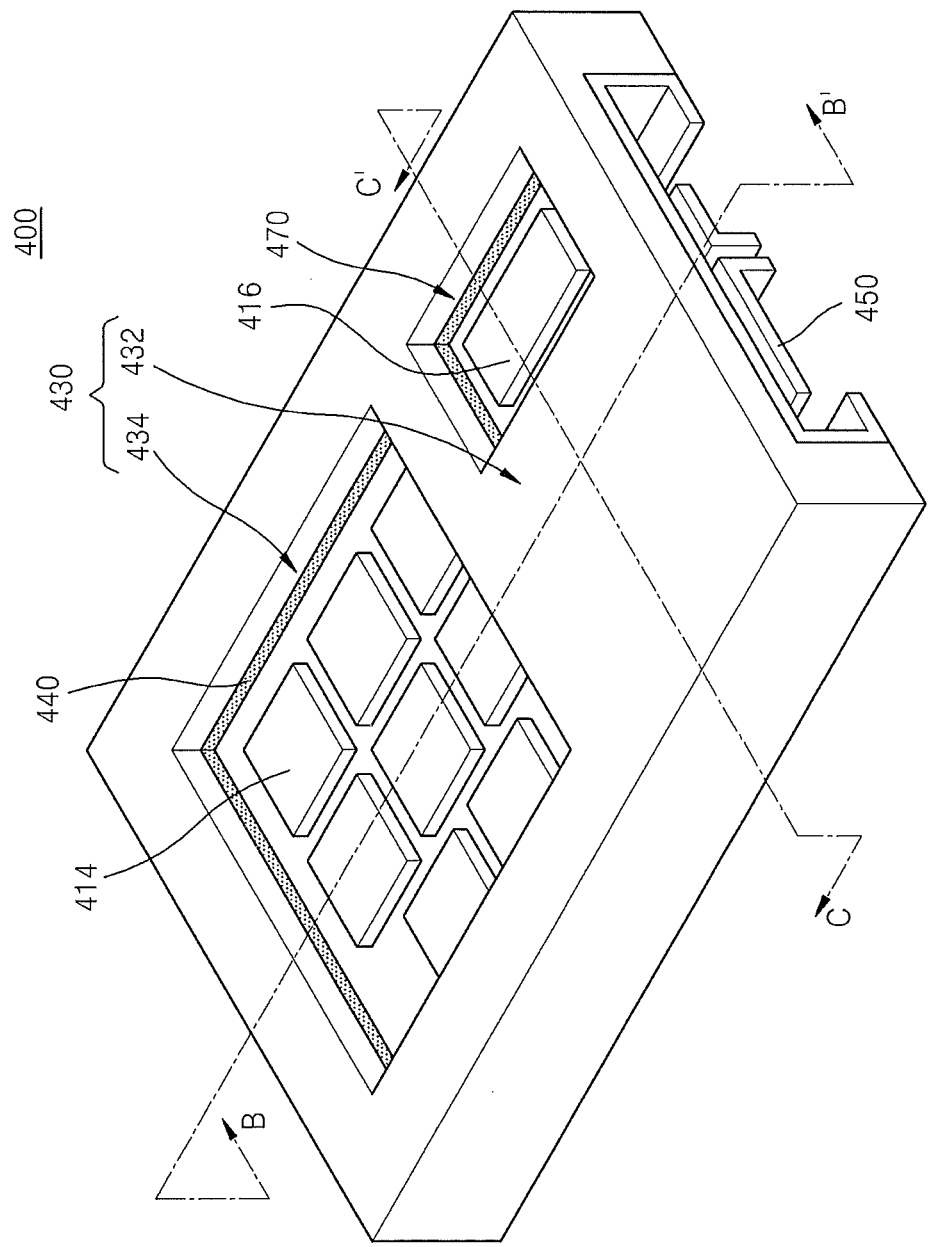
FIG. 11A is a perspective view of a secondary memory device according to embodiments of the inventive concept.
Figure 11B:
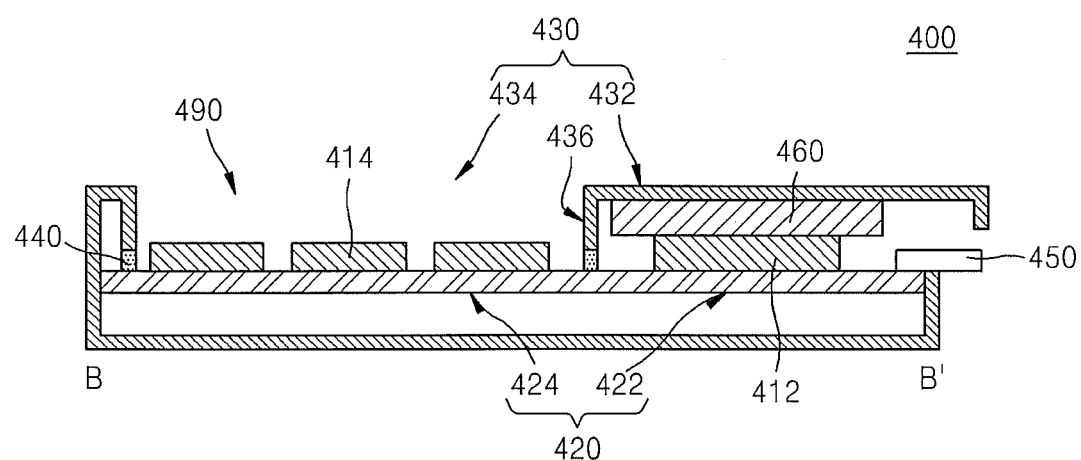
FIGS. 11B and 11C are lateral cross-sectional views of the secondary memory device of FIG. 11A taken along lines B-B' and C-C', respectively.
Figure 11C:
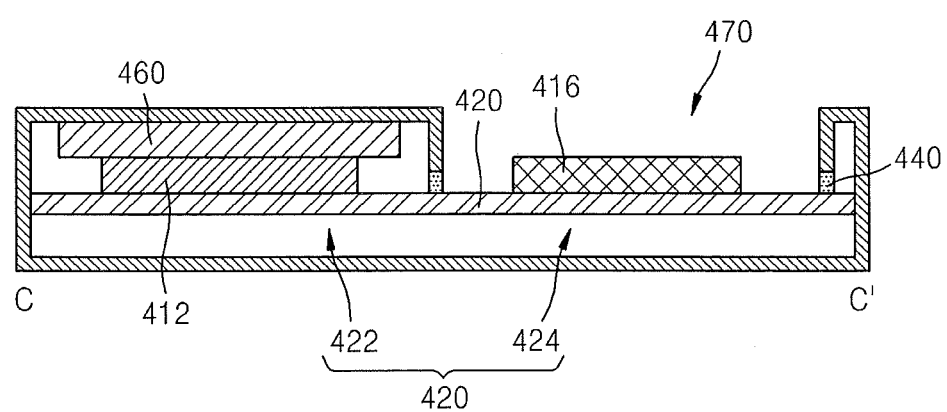

FIG. 11A is a perspective view of an SSD 400 according to an embodiment of the inventive concept. FIGS. 11B and 11C are lateral cross-sectional views of the SSD 400 of FIG. 11A taken along lines B-B' and C-C', respectively.

Referring to FIGS. 11A through 11C, a controller 412, a nonvolatile memory device 414, and a volatile memory device 416 are provided on a substrate 420. The controller 412 may be provided on a first region 422 of the substrate 420. The nonvolatile memory device 414 and the volatile memory device 416 may be provided on a second region 424 of the substrate 420. Heat generated by the controller 412 is greater than the heat generated by the nonvolatile memory device 414 and the volatile memory device 416 and thus an efficient heat dissipation of the controller 412 is desirable.

A housing 430 that accommodates at least a part of the substrate 420 includes a first portion or first sub-housing 432 covering the first region 422 of the substrate 420. The first sub-housing 432 may cover or overlie the controller 412. A heat transfer medium 460 may be disposed between the first sub-housing 432 and the controller 412.

The substrate 420, the controller 412, the nonvolatile memory device 414, the heat transfer medium 460, a connector 450, and a block wall 436 are the same as described with reference to FIGS. 2A and 2B, and thus detailed descriptions thereof are omitted here.

The volatile memory device 416 may be, for example, a dynamic random access memory (DRAM) device. The volatile memory device 416 may function as a buffer in a data exchange between the nonvolatile memory device 414 and the controller 412.

The first sub-housing 432 (or an upper surface thereof) may extend to or over an upper portion of the controller 412 but does not extend to or over the second region 424 of the substrate 420. When the first sub-housing 432 extends to the second region 424 over the upper portion of the controller 412, heat transferred from the controller 412 to the first sub-housing 432 may be further transferred in a horizontal direction of FIGS. 11B and 11C so that a temperature of the nonvolatile memory device 414 and/or the volatile memory device 416 in the second region 424 may rise.

The housing 430 may include a second portion or second sub-housing 434 having front, top or upper open portions 470 and 490 formed in the upper surface of the second sub-housing 434 and exposing at least a part of the second region 424 of the substrate 420. The front open portions 470 and 490 expose at least a part of the second region 424 so that at least a part of the nonvolatile memory device 414 and/or the volatile memory device 416 may be exposed to the outside. Accordingly, heat generated by the controller 412 may be inhibited or prevented from being transferred to the nonvolatile memory device 414 and/or the volatile memory device 416 over or through the housing 430.

Also, the heat generated by the nonvolatile memory device 414 and/or the volatile memory device 416 may be directly removed to the outside by convection, thereby contributing to the inhibition of temperature rises of the nonvolatile memory device 414 and the volatile memory device 416.

As described with reference to FIGS. 6A and 6B, a first spacer 440 may be provided between the substrate 420 and the block wall 436. The first spacer 440 may be formed of a material having a lower thermal conductivity than that of the housing 430. The material is described with reference to FIGS. 2A and 2B and thus a detailed description thereof is omitted here. The first spacer 440 may function as a sealing material for maintaining a seal between the housing 430 and the substrate 420. In this case, the first spacer 440 may be formed of an elastic material.

As shown in FIG. 11A, parts of the substrate second region 424 in which the nonvolatile memory device 414 and the volatile memory device 416 are mounted may be configured to be distinguished or separated from each other by the housing 430. The front open portions 470 and 490 may be formed only in parts of the second region 424 where heat dissipation is desirable, and a part having a relatively low necessity of the heat dissipation may be protected by being covered by the housing 430.

Figure 12:
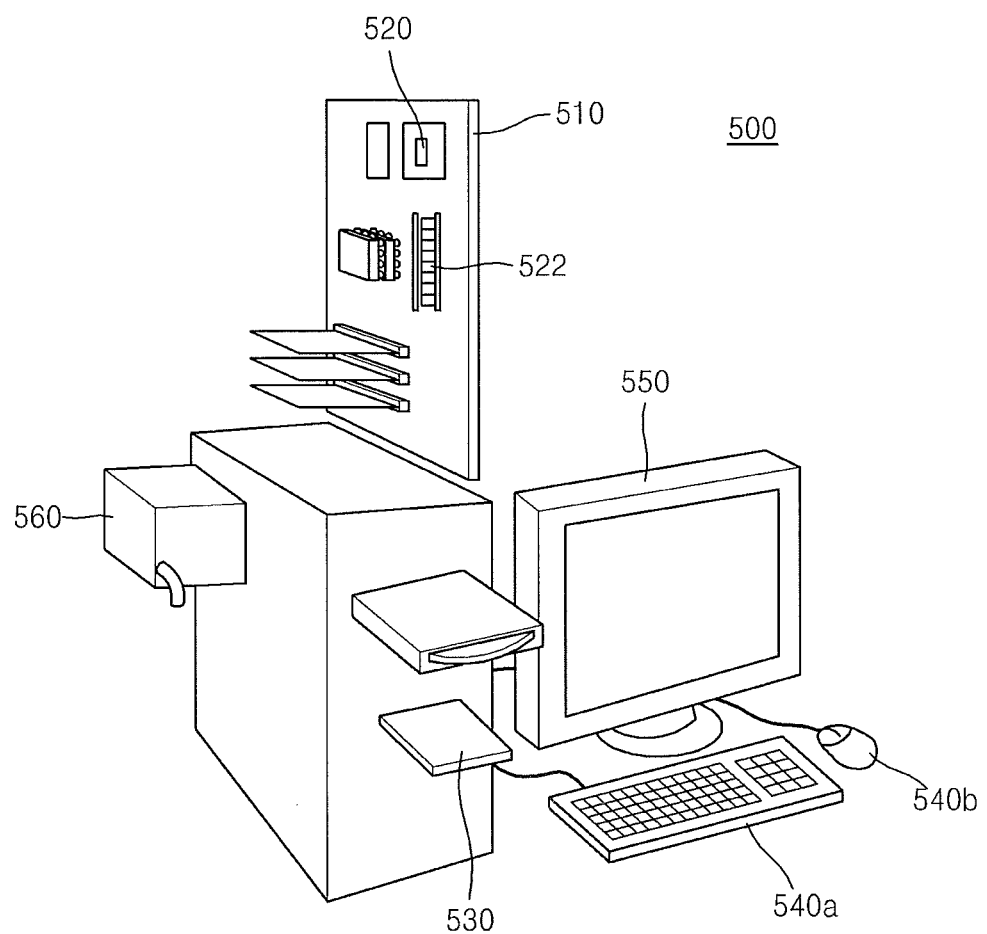
FIG. 12 is conceptual perspective view of a system according to embodiments of the inventive concept.

FIG. 12 is conceptual perspective view of a system 500 according to an embodiment of the inventive concept.

Referring to FIG. 12, the system 500 may include a main board 510, a central processing device 520 mounted on the main board 510, a secondary memory device 530, input devices 540a and 540b, and an output device 550. The secondary memory device 530 may be one of the above-described secondary memory devices.

The input devices 540a and 540b may be a keyboard, a mouse, or a touch screen, but are not limited thereto. The input devices 540a and 540b may be devices for inputting data to the central processing device 520. The output device 550 may be a monitor or a printer, but is not limited thereto. The output device 550 may be a device for outputting data from the central processing device 520. The input devices 540a and 540b and the output device 550 may be combined in a single device.

The central processing device 520 and a main memory device 522 may be mounted on the main board 510. The main memory device 522 may be, for example, a RAM module such as a DRAM. Also, the main board 510 may be configured to additionally mount a video card or a communication card. The main board 510 may be configured to exchange information with the secondary memory device 530 by using a communication standard such as SATA or SATA-II.

Also, the system 500 may include a power supply device 560 to supply power required for operating the main board 510.

The system 500 may be a desktop personal computer (PC), a laptop PC, a smart phone, a tablet PC, a portable multimedia player (PMP), a navigation system, and a flat panel display device (e.g., a flat panel display television), for example.

The secondary memory device of the present inventive concept may improve the entire performance by preventing a thermally vulnerable device from functioning as the bottleneck in implementing performance.

While the inventive concept has been particularly shown and described with reference to exemplary embodiments thereof, it will be understood that various changes in form and details may be made therein without departing from the spirit and scope of the following claims.

What is claimed is:

1. A secondary memory device comprising:
a substrate having upper and lower opposed surfaces, the substrate comprising a first region in which a first semiconductor device is mounted on the upper surface and a second region in which a second semiconductor device is mounted on the upper surface; and
a housing configured to accommodate at least a part of the substrate,
wherein the housing comprises a first sub-housing covering the upper surface of the substrate at the first region and the first semiconductor device, and
a heat transfer medium is between the first sub-housing and the first semiconductor device, and
wherein the first sub-housing does not extend to cover the upper surface of the substrate at the second region.

2. The secondary memory device of claim 1, wherein the housing further comprises a second sub-housing covering at least a portion of the upper surface of the substrate at the second region and the second semiconductor device,
wherein an upper surface of the housing has an opening defined therein between the first sub-housing and the second sub-housing, the opening exposing a portion of the upper surface of the substrate between the first semiconductor device and the second semiconductor device.

3. The secondary memory device of claim 2, further comprising: a block wall formed between the first sub-housing and the second sub-housing and configured to inhibit convection between the first sub-housing and the second sub-housing.

4. The secondary memory device of claim 2, wherein the housing comprises a lower open portion through which at least a part of the lower surface of the substrate is exposed.

5. The secondary memory device of claim 4, further comprising: a first cover unit configured to detachably cover the lower open portion.

6. The secondary memory device of claim 4, wherein one or more super capacitors are mounted on the lower surface of the substrate exposed by the lower open portion.

7. The secondary memory device of claim 1, wherein a plurality of holes are formed in the housing.

8. The secondary memory device of claim 7, further comprising a second sub-housing partially covering the upper surface of the substrate at the second region, wherein the plurality of holes are formed in the second sub-housing to at least partially expose the upper surface of the substrate at the second region and/or the second semiconductor device.

9. The secondary memory device of claim 1, further comprising: a connector configured to transmit a signal between the substrate and an external device or power supply,
wherein a distance between the first semiconductor device and the connector is shorter than a distance between the second semiconductor device and the connector.

10. The secondary memory device of claim 1, wherein the housing comprises a second sub-housing comprising an upper open portion exposing at least a part of the upper surface of the substrate at the second region.

11. The secondary memory device of claim 10, wherein the housing comprises a first spacer disposed between the first sub-housing and the substrate and having a thermal conductivity lower than that of the first sub-housing.

12. The secondary memory device of claim 11, wherein the first spacer is formed of an elastic material.

13. The secondary memory device of claim 10, further comprising: a second cover unit configured to cover the upper open portion,
wherein the second cover unit is configured to detachably couple to the second sub-housing.

14. The secondary memory device of claim 1, wherein:
the housing comprises a block wall extending from an upper portion of the first sub-housing toward the upper surface of the substrate and between the first semiconductor device and the second semiconductor device, and
the block wall is spaced apart from the first semiconductor device.

15. The secondary memory device of claim 14, further comprising a spacer between the block wall and the substrate, wherein the spacer is spaced apart from the first semiconductor device.

16. The secondary memory device of claim 15, wherein the spacer has a thermal conductivity lower than that of the first sub-housing.

17. The secondary memory device of claim 14, wherein the housing further comprises a second sub-housing covering at least a portion of the upper surface of the substrate at the second region and the second semiconductor device,
wherein the housing has an opening defined therein between first sub-housing and the second sub-housing, the opening exposing a portion of the upper surface of the substrate between the first semiconductor device and the second semiconductor device,
wherein the block wall extends from an upper portion of the second sub-housing and from the upper portion of the first sub-housing toward the upper surface of the substrate at the opening, and
wherein the secondary memory device further comprises a spacer between the block wall and the upper surface of the substrate.

18. The secondary memory device of claim 17, wherein the spacer has a thermal conductivity lower than that of the housing.

19. A solid state drive (SSD) comprising:
a substrate;
a nonvolatile memory device mounted on the substrate;
a controller device configured to control the nonvolatile memory device mounted on the substrate; and
a housing configured to accommodate the substrate,
wherein a part of the housing comprises an open portion exposing at least a part of the substrate between the nonvolatile memory device and the controller device,
wherein the housing comprises a block wall that extends toward the substrate at the open portion, and
wherein a spacer is between the block wall and the substrate.

20. A secondary memory device comprising:
a housing;
a substrate having upper and lower opposing surfaces, the substrate held at least partially within the housing;
a first semiconductor device on the upper surface of the substrate at a first region of the substrate;
a second semiconductor device on the upper surface of the substrate at a second region of the substrate;
wherein the housing has an upper surface, the upper surface of the housing covering the first semiconductor device, the upper surface of the housing including an opening disposed between the first semiconductor device and the second semiconductor device and exposing a portion of the substrate upper surface,
wherein the housing includes a guide wall extending downwardly from the upper surface of the housing toward the upper surface of the substrate at the opening in the upper surface of the housing,
the secondary memory device further comprising a spacer between the guide wall and the upper surface of the substrate.

* * * * *